(12) United States Patent
Li et al.

(10) Patent No.: US 10,578,784 B2
(45) Date of Patent: Mar. 3, 2020

(54) COLOR-FILTER ON ARRAY (COA) DISPLAY PANEL, MANUFACTURING METHOD THEREOF AND COA DISPLAY DEVICE

(71) Applicant: Shenzhen China Star Optoelectronics Technology Co., Ltd., Shenzhen, Guangdong (CN)

(72) Inventors: Zhenya Li, Guangdong (CN); Chengcai Dong, Shenzhen (CN); Qiaoqiao Song, Guangdong (CN); Xiaohui Yao, Guangdong (CN); Tien-Chun Huang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 79 days.

(21) Appl. No.: 15/739,744

(22) PCT Filed: Oct. 20, 2017

(86) PCT No.: PCT/CN2017/107011
§ 371 (c)(1),
(2) Date: Dec. 24, 2017

(87) PCT Pub. No.: WO2019/041480
PCT Pub. Date: Mar. 7, 2019

(65) Prior Publication Data
US 2019/0072696 A1 Mar. 7, 2019

(30) Foreign Application Priority Data

Sep. 4, 2017 (CN) .......................... 2017 1 0788229

(51) Int. Cl.
*G02F 1/1335* (2006.01)
*G02B 5/20* (2006.01)
(Continued)

(52) U.S. Cl.
CPC ....... *G02B 5/201* (2013.01); *G02F 1/133516* (2013.01); *G02F 1/133707* (2013.01);
(Continued)

(58) Field of Classification Search
CPC ............. G02F 1/1362; G02F 1/136227; G02F 1/12394; G02F 1/133788
(Continued)

(56) References Cited

U.S. PATENT DOCUMENTS 6,429,916 B1 * 8/2002 Nakata .............. G02F 1/136227
349/106
2008/0297677 A1 * 12/2008 Kang ..................... G02F 1/1362
349/43
(Continued)

FOREIGN PATENT DOCUMENTS

CN 101738778 A 6/2010
CN 104516153 A 4/2015
(Continued)

*Primary Examiner* — Audrey Y Chang
(74) *Attorney, Agent, or Firm* — Andrew C. Cheng

(57) ABSTRACT

A color-filter on array (COA) display panel is provided. The COA display panel includes an array substrate, a color filter substrate disposed opposite to the array substrate, a component layer disposed on the array substrate, and a color resist layer covering the component layer; wherein the color resist layer is configured with at least one through hole, and an edge of an opening of the at least one through hole is arc-shaped.

20 Claims, 4 Drawing Sheets

(51) Int. Cl.
    *G02F 1/1337*     (2006.01)
    *H01L 27/12*     (2006.01)
    *H01L 29/786*     (2006.01)
    *G02F 1/1362*     (2006.01)

(52) U.S. Cl.
    CPC .... *G02F 1/136227* (2013.01); *H01L 27/1225* (2013.01); *H01L 27/1288* (2013.01); *H01L 29/7869* (2013.01); *G02F 2001/136222* (2013.01); *G02F 2201/123* (2013.01)

(58) Field of Classification Search
    USPC .......................................... 349/106; 257/59
    See application file for complete search history.

(56) References Cited

U.S. PATENT DOCUMENTS

| | | | |
|---|---|---|---|
| 2009/0231522 A1* | 9/2009 | Kim | G02F 1/13394 349/106 |
| 2010/0053507 A1 | 3/2010 | Song et al. | |
| 2011/0001138 A1* | 1/2011 | Huang | H01L 27/1214 257/59 |
| 2014/0211135 A1* | 7/2014 | Jung | G02F 1/133788 349/106 |
| 2015/0092138 A1* | 4/2015 | Kwak | G02F 1/133512 349/85 |
| 2015/0346546 A1 | 12/2015 | Hui | |

FOREIGN PATENT DOCUMENTS

| | | |
|---|---|---|
| CN | 106444190 A | 2/2017 |
| CN | 106950769 A | 7/2017 |
| CN | 107479286 A | 12/2017 |

\* cited by examiner

COLOR-FILTER ON ARRAY (COA) DISPLAY PANEL, MANUFACTURING METHOD THEREOF AND COA DISPLAY DEVICE

BACKGROUND OF THE INVENTION

1. Field of the Invention

The present disclosure relates to liquid crystal display technology, and more particularly to a color-filter on array (COA) display panel, a manufacturing method thereof and a COA display device.

2. Discussion of the Related Art

With the constant development of LCD display technology, the LCD panel has been applied into user's life, like personal computer, smart phone, and tablet.

The operation of the LCD is that after a backlight emits white light, the white light passes through the polarizer of the array substrate, due to the change in the twisted angle of liquid crystal, the status of the polarized light is also changed. After the light passes through the polarizer of the color filter substrate, the brightness corresponding to the pixel electrode is also different. A color resist is further added on the color filter substrate, such that the mixed brightness of different color pixels are different, so as to realize color display.

In order to increase the aperture ratio and reduce the difficulty of aligning the top and bottom substrates, to simplify the process, a color-filter on array (COA) technology is widely used. However, for COA display panel, due that the color filter substrate is directly covered on the array substrate, when electrode signals are connected, the through hole is needed. Furthermore, in addition that a corresponding passivation layer needs to be etched, different thicknesses of the color resist layer are needed to dig.

Due that the color resist layer is generally thicker, in the digging process, a steep step is easily formed. In the subsequent process of applying the alignment solution, the alignment solution is easily piled up in the step, which results in poor alignment and generates mura abnormality.

SUMMARY

The present disclosure relates to a color-filter on array (COA) display panel, a manufacturing method thereof and a COA display device, which can reduce mura abnormality of the COA display panel and improve displaying quality.

In one aspect, a color-filter on array (COA) display panel is provided. The COA display panel includes an array substrate, a color filter substrate disposed opposite to the array substrate. A component layer is disposed on the array substrate, and a color resist layer covers the component layer; wherein the color resist layer is configured with at least one through hole, and an edge of an opening of the at least one through hole is arc-shaped.

In another aspect, a color-filter on array (COA) display device is provided. The COA display device includes a COA display panel and a backlight module disposed corresponding to the COA display panel. The COA display panel includes an array substrate, a color filter substrate disposed opposite to the array substrate, a component layer disposed on the array substrate, and a color resist layer covering the component layer, wherein the color resist layer is configured with at least one through hole, and an edge of an opening of the at least one through hole is arc-shaped.

In another aspect, a manufacturing method of a color-filter on array (COA) display panel is provided. The manufacturing method includes forming a component layer on a first substrate; and covering a color resist layer on the component layer, and forming at least one through hole on the color resist layer; wherein an edge of an opening of the at least one through hole is arc-shaped.

In view of the above, the present disclosure provides forming a component layer on a first substrate; and covering a color resist layer on the component layer, and forming at least one through hole on the color resist layer; wherein an edge of an opening of the at least one through hole is arc-shaped. The disclosure also provides a display device utilizing the GOA circuit of the disclosure. Due that an edge of an opening of the through hole is arc-shaped, such that the landform near the through hole is smooth. Therefore, the alignment solution can flow into the through hole smoothly, and is not piled up in the edge of the through hole, so as to display images normally.

DETAILED DESCRIPTION OF THE EMBODIMENTS

Among the specification and the scope of subsequent terms are used to refer to specific components. Those of skill in the art will appreciate that manufacturers may use different terms to refer to the same components. The patent specification and subsequent differences in the name of the range is not to be used as a way to distinguish between the components, but with differences in the functional components as distinguished benchmarks. Embodiments of the invention will now be described more fully hereinafter with reference to the accompanying drawings, in which embodiments of the invention are shown.

Figure 1:
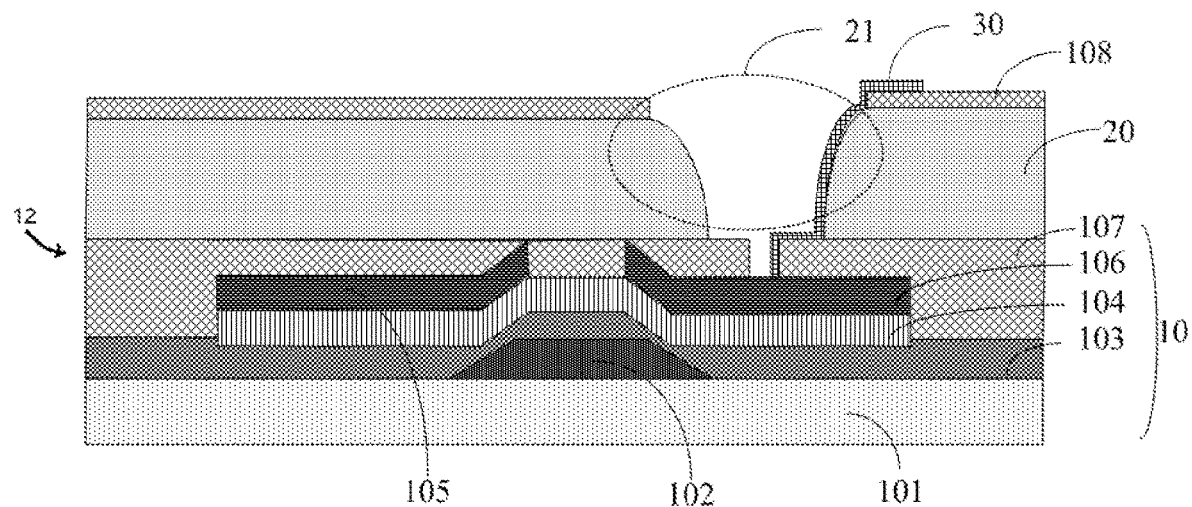
FIG. 1 is a cross-sectional schematic diagram of a COA display panel in accordance with one embodiment of the present disclosure.

FIG. 1 is a cross-sectional schematic diagram of a color-filter on array (COA) display panel in accordance with one embodiment of the present disclosure.

Figure 6:
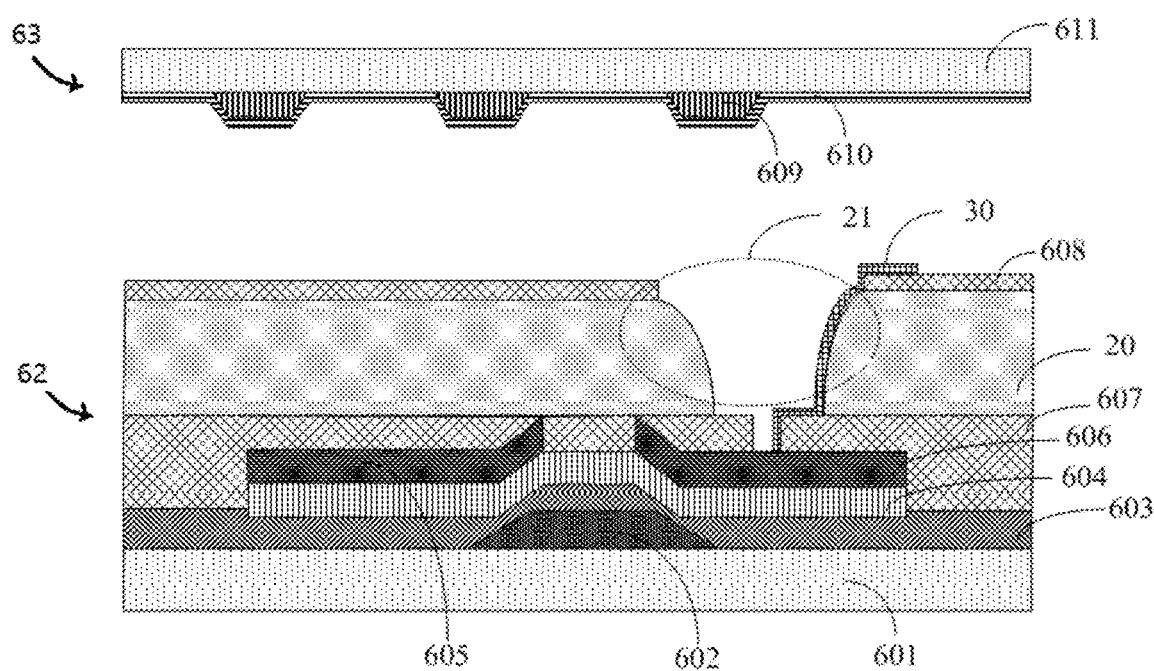
FIG. 6 is a schematic diagram of a COA display panel in accordance with one embodiment of the present disclosure.

Specifically, as shown in FIG. 6, in the embodiment, the COA display panel includes an array substrate 62, and a color filter substrate 63 disposed opposite to the array substrate 62. The color filter substrate 63 includes a second substrate 611, a mask layer 610, and a common electrode layer 609 from top to bottom. A liquid crystal layer (not shown) is disposed between the array substrate 62 and the color filter substrate 63.

Figure 2:
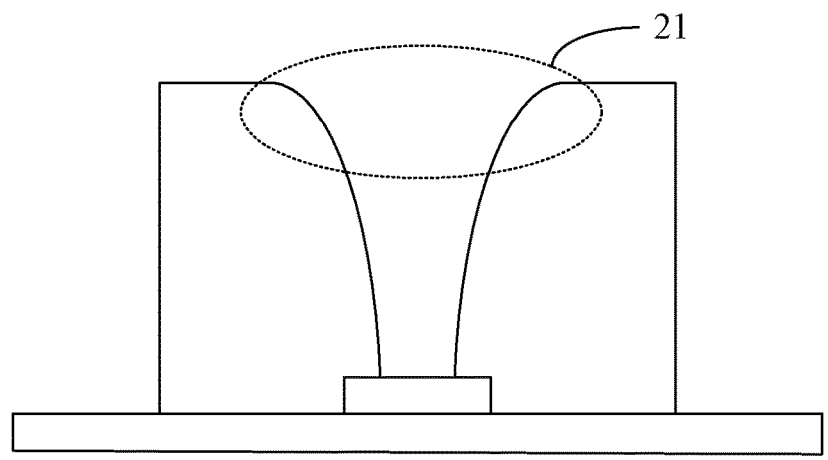
FIG. 2 is a cross-sectional schematic diagram of the through hole of the COA display panel of FIG. 1 in accordance with one embodiment of the present disclosure.

As shown in FIG. 1, the array substrate 12 includes a component layer 10 and a color resist layer 20 covering and disposed on the component layer 10, wherein the color resist layer 20 is configured with at least one through hole 21, and an edge of an opening of the through hole 21 is arc-shaped, as shown in FIG. 2, and FIG. 2 is a cross-sectional schematic diagram of the through hole 21 of the COA display panel of FIG. 1 in accordance with one embodiment of the present disclosure.

Referring to FIG. 1, a pixel electrode 30 is formed on the color resist layer 20, and the pixel electrode is connected with a source or a drain of the component layer through the through hole 21. As shown in FIG. 1, the at least one through hole 21 is defined by the color resist layer 20.

It is noted that due that structure of the component layer is more complicated, the number of thin-film transistors is much greater than the number of the pixel electrodes. Therefore, in another embodiment, the through hole 21 is further configured to be connected with other layers or other components of the COA display panel, and it is not limited thereto.

Specifically, as shown in FIG. 1, the component layer includes a first substrate 101, a gate 102 formed on the first substrate, and a gate insulation layer 103 and an oxide thin-film layer 104 sequentially formed on the gate. The oxide thin-film layer 104 includes a source 105 and a drain 106, wherein the source 105 and the drain 106 are separated by a channel. The source 105, and the drain 106, and the channel are covered by a first passivation layer 107, and the color resist layer 20 is formed on a surface of the first passivation layer 107.

Alternatively, the color resist layer 20 is covered by a second passivation layer 108. As shown in FIG. 1, the second passivation layer 108 is located between the color resist layer 20 and the pixel electrode 30.

Specifically, the first substrate 101 includes a glass substrate and a quartz substrate. In another embodiment, the first substrate 101 may be another substrate, and it is not limited thereto.

The gate 102 is formed by: forming a metal film layer on the first substrate by a deposition; exposing the metal film layer via a first mask, and etching the metal film layer to form the gate 102, wherein the first mask is a mask capable of etching only one layer.

The metal film layer includes at least one of Al, Mo, Cu and Ag. In another embodiment, the metal film layer may be other metals, and it is not limited thereto.

The gate insulation layer 103 includes at least one of SiNx and SiOx. In another embodiment, the gate insulation layer 103 may be other insulation material, and it is not limited thereto.

The oxide thin-film layer 104 is a transparent oxide, and may include at least one of zinc oxide (ZnO)-based, stannous oxide ($SnO_2$)-based and indium oxide ($In_2O_3$)-based. In another embodiment, the oxide thin-film layer 104 may be other transparent oxide, and it is not limited thereto.

The source 105 and the drain 106 are formed by: depositing a metal layer on the oxide thin-film layer 104; after patterning the source 105 and the drain 106, etching other portion of the metal layer except the source 105 and the drain 106; and etching the portion of the metal layer corresponding to the channel to be exposed to form.

In another embodiment, a surface of the metal layer is covered by a photo resist. When the metal layer is etched to form the channel, the photo resist is also etched, such that part of the channel is exposed.

The first passivation layer 107 includes at least one of SiNx and SiOx. In another embodiment, the first passivation layer 107 may be other passivation material, and it is not limited thereto.

The color resist layer 20 includes red, green, blue three color resist arranged in order.

Specifically, the color resist layer 20 is formed by: applying the color resist layer 20 on first passivation layer 107, and exposing the color resist layer 20 by using a gray level mask, such that the color resist layer 20 has areas of different thickness. At least one through hole 21 is formed by etching part of the color resist layer. The through hole 21 is corresponding to a through hole of the first passivation layer 107 to expose part of the drain 106 or the source 105, such that the source 105 or the drain 106 is connected with the corresponding signal line via the through hole. For example, the drain 106 is connected with the pixel electrode 30, or the source 105 is connected with the pixel electrode 30.

An edge of an opening of the through hole 21 is arc-shaped. The arc shape may be a half-circle, or other non-rectangle arc angle, and the edge of the opening of the through hole 21 is smooth. Due that the edge of the opening of the through hole 21 is arc-shaped, it is effectively avoided that liquid is piled up outside the through hole 21 in the process, for example, in the process of forming an alignment film. Due that an alignment solution can be directly flowed into the through hole via the arc-shaped edge of the opening of the through hole, it is avoided that the alignment solution is piled up because of the steep opening of the through hole, so as to improve the displaying quality of the COA display panel.

Figure 3:
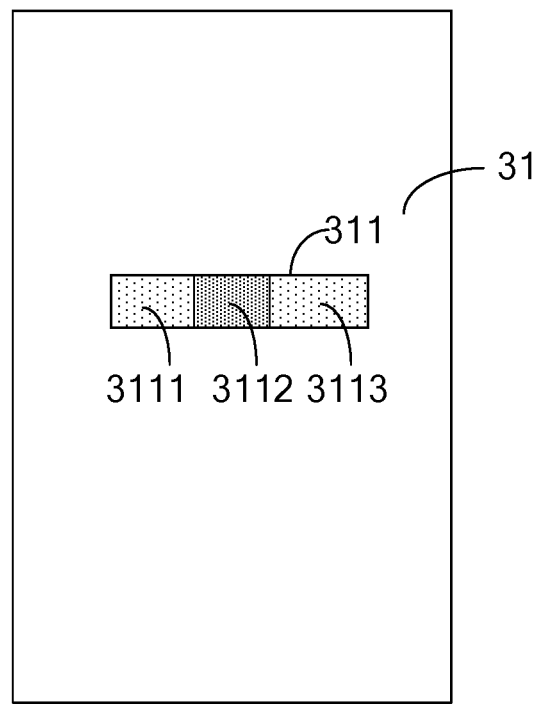
FIG. 3 is a top-view schematic diagram of a mask forming the through hole of FIG. 1 in accordance with one embodiment of the present disclosure.

In one embodiment, the through hole 21 is formed by exposing the color resist layer by using a half tone mask (HTM). For example, by utilizing the area of semi-permeable membrane and exposure amount, such that the thickness of the corresponding color resist on the scanning line is different from the thickness of displaying area. That is, the edge of the opening of the through hole 21 on the color resist layer is arc-shaped. FIG. 3 is a top-view schematic diagram of a mask forming the through hole of FIG. 1 in accordance with one embodiment of the present disclosure. Referring to FIG. 3, numeral 31 is an HTM mask and numeral 311 is an opening of the mask, wherein the size and the location of the opening 311 of the mask is corresponding to the size and the location of the through hole 21 of the color resist layer. Furthermore, as shown in FIG. 3, the opening 311 of the mask includes three semi-permeable membranes 3111, 3112 and 3113 that have different transmittances. In one embodiment, the transmittance of the semi-permeable membrane 3111 is the same as the transmittance of the semi-permeable membrane 3113. Therefore, by exposing the color resist via the opening of the mask that have different transmittances, the height difference of landform is smooth near the through hole, not steep, such that the alignment solution can flow into the through hole smoothly, and is not piled up in the edge of the through hole, so as to display images normally.

Figure 4:
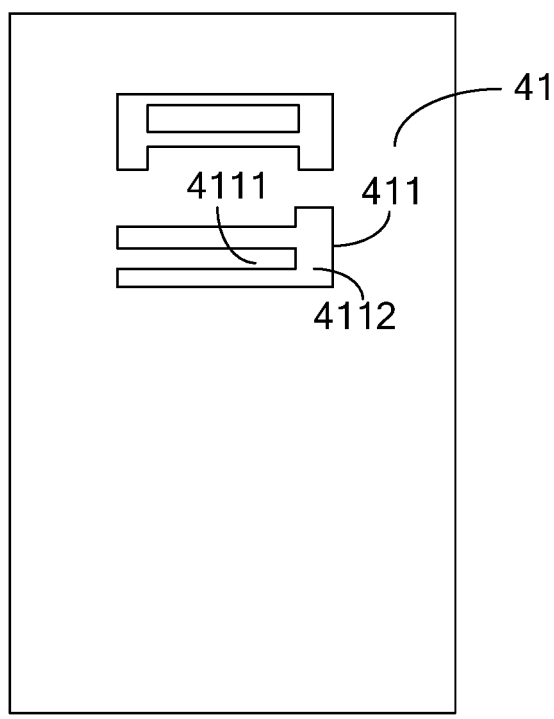
FIG. 4 is a top-view schematic diagram of a mask forming the through hole of FIG. 1 in accordance with another embodiment of the present disclosure.

In another embodiment, as shown in FIG. 4, FIG. 4 is a top-view schematic diagram of a mask forming the through hole of FIG. 1 in accordance with another embodiment of the present disclosure. In the embodiment, numeral 41 is a mask. The mask 41 has a slit in the opening 411 of the mask, and the size and the location of the opening 411 of the mask is corresponding to the size and the location of the through hole 21 of the color resist layer. The opening 411 of the mask has a plurality of slits 4111 and openings 4112. Therefore, by exposing the color resist layer via the opening 411 of the mask, due that the exposure amount of the slit 4111 is less than the exposure amount of the opening 4112, a little light through the slit 4111 can generate a diffraction, such that the photoresist corresponding to the slit 4111 and the photoresist nearby form a smooth edge of the opening, wherein the thickness is decreasing slowly. Therefore, an arc-shape of the edge of the through hole is formed via the slit 4111 and the opening 4112. After exposure and etch, the opening of the through hole nearby form smooth landform. When applying the alignment solution, the alignment solution can flow into the through hole smoothly, and is not piled up in the edge of the opening, so as to display images normally.

Wherein the slit 4111 is formed on at least one lateral side of the opening 4112 of the through hole. In one preferred embodiment, the slits 4111 are disposed on all lateral sides of the opening 4112. In another embodiment, if the distance between the through holes is close to each other, in order not to affect the operation of other through holes, the slit 4111 can be disposed on another side of the through hole, and it is not limited thereto.

In one embodiment, a width of the slit 4111 is between 4 μm and 9 μm. Due to above width range, the difference between the width of the slit and the opening of the conventional mask can be enlarged, and the exposure amount can be insured. It is noted that the width of the slit 4111 described above is a preferred range, the difference, for example, 10% or 20%, between the practical width of the slit and the width of the slit described above is belong to the scope of the present disclosure.

It is noted that the shape of the slit and the extended orientation of the slit are not limited to the shown in FIG. 4. It can be other changes to realize the smooth angle of the through hole 21, and it is not limited thereto.

Figure 5:
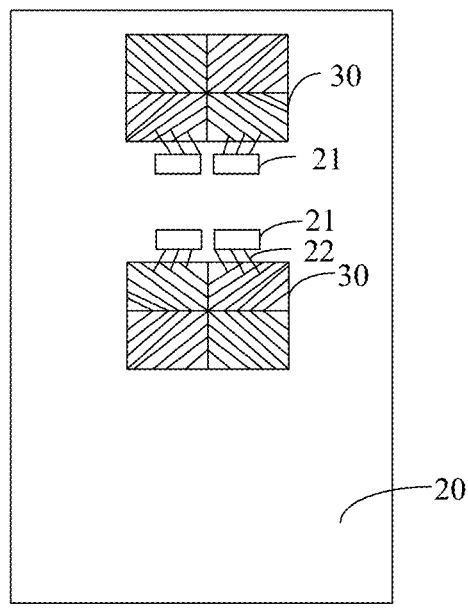
FIG. 5 is a top-view schematic diagram of the location relationship between the pixel electrode and the through hole in accordance with another embodiment of the present disclosure.

In another embodiment, to reduce the pile up of the alignment solution, the color resist further includes a flow channel, the flow channel is connected with the at least one through hole, and the flow channel extends to the corresponding area of the pixel electrode. As shown in FIG. 5, FIG. 5 is a top-view schematic diagram of the location relationship between the pixel electrode and the through hole in accordance with another embodiment of the present disclosure. In the embodiment of FIG. 5, the through hole 21 is spaced apart from the pixel electrode 30 and connected with the pixel electrode 30 through the flow channel 22 that is connected with the through hole 21, and the flow channel 22 extends to the corresponding area of the pixel electrode 30.

In the embodiment, when applying the alignment solution, due to the flow channel 22, the alignment solution in the through hole 21 can be guided outside effectively through the flow channel 22, and due that the flow channel 22 extends to the corresponding area of the pixel electrode 30, and the material of the pixel electrode and the alignment solution are attractive with each other, such that the efficiency can be increased, therefore avoiding that the alignment solution is piled up inside the through hole 21 or in the edge of the through hole, so as to insure displaying images normally.

The pixel electrode includes ITO electrode. In another embodiment, the ITO electrode can be replaced by another electrode, and it is not limited thereto.

Referring to FIG. 6, the COA display panel in the embodiment includes a first substrate 601; a gate 602, a gate insulation layer 603 and an oxide thin-film layer 604 sequentially formed on the first substrate 601; a source 605 and a drain 606 separated by a channel; a first passivation layer 607 formed on the source 605, the drain 606 and areas that are not covered by the source 605 and the drain 606, and a color resist layer 20 covering the first passivation layer, 607, wherein the color resist layer 20 is configured with at least one through hole, and an edge of an opening of the at least one through hole is arc-shaped, such that the source 605 or the drain 606 is connected with the corresponding signal line or the electrode via the through hole. Therefore, the landform near the through hole is smooth, and the alignment solution can flow into the through hole smoothly, and is not piled up in the edge of the through hole, so as to display images normally.

Besides, the present disclosure provides a COA display device. The COA display device includes the COA display panel of one of the above embodiments and a backlight module disposed correspondingly. Therefore, the landform near the through hole is smooth, and the alignment solution can flow into the through hole smoothly, and is not piled up in the edge of the through hole, so as to display images normally.

Figure 7:
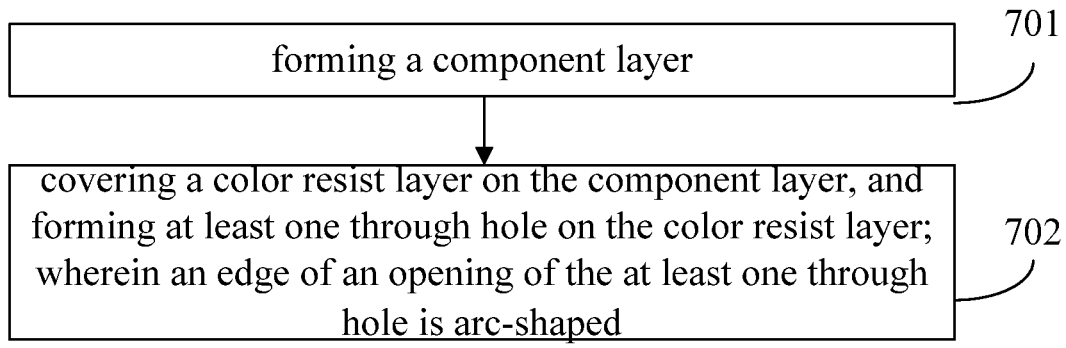
FIG. 7 is a flow chart of a manufacturing method of a COA display panel in accordance with one embodiment of the present disclosure.
Figure 8:
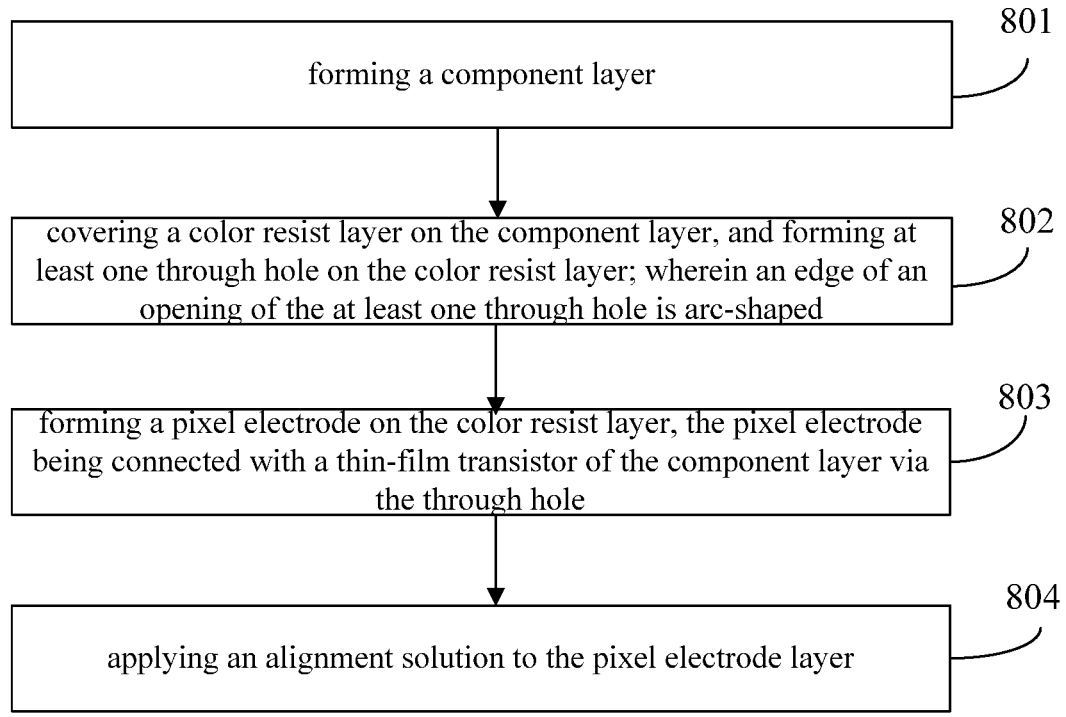
FIG. 8 is a flow chart of a manufacturing method of a COA display panel in accordance with another embodiment of the present disclosure.

Referring to FIG. 7, FIG. 7 is a flow chart of a manufacturing method of a COA display panel in accordance with one embodiment of the present disclosure. As shown in FIG. 7, the manufacturing method of the embodiment includes step 701: forming a component layer; and step 702: covering a color resist layer on the component layer, and forming at least one through hole on the color resist layer; wherein an edge of an opening of the at least one through hole is arc-shaped.

Wherein the component layer is a thin-film transistor layer. The thin-film transistor layer includes a first substrate, a gate formed on the first substrate, a gate insulation layer and an oxide thin-film layer sequentially formed on the gate, the oxide thin-film layer further comprises a source and a drain; wherein the source and the drain are separated by a channel. The source, the drain and the channel are covered by a first passivation layer.

Wherein the first substrate includes a glass substrate and a quartz substrate. In another embodiment, the first substrate may be another substrate, and it is not limited thereto.

Specifically, a metal film layer is formed on the first substrate by a deposition; exposing the metal film layer via a first mask, and etching the metal film layer to form the gate. The metal film layer includes at least one of Al, Mo, Cu and Ag. In another embodiment, the metal film layer may be other metals, and it is not limited thereto.

An etching process generally refers to that portions of the film not covered by the etchant resist are removed to form exactly the same pattern as the pattern of the etchant resist in the film. The etching process generally includes dry etching or wet etching. However, the present embodiment is not limited in this regard, as long as the first gate electrode can be etched in the metal film.

After the gate is formed, a gate insulation layer and an oxide thin-film layer are deposited on a surface of the gate.

Wherein the gate insulation layer includes at least one of SiNx and SiOx. In another embodiment, the gate insulation layer may be other insulation material, and it is not limited thereto.

The oxide thin-film layer is a transparent oxide, and may include at least one of zinc oxide (ZnO)-based, stannous oxide ($SnO_2$)-based and indium oxide ($In_2O_3$)-based. In another embodiment, the oxide thin-film layer may be other transparent oxide, and it is not limited thereto.

Specifically, after the gate, the gate insulation layer and the oxide thin-film layer are formed on the first substrate, a metal layer is deposited on the oxide thin-film layer. The metal film layer includes at least one of Mo and Ag. In another embodiment, the metal film layer may be other metals, and it is not limited thereto.

After patterning the source and the drain, etching other portion of the metal layer except the source and the drain; and etching the portion of the metal layer corresponding to the channel to be exposed.

In another embodiment, a surface of the metal layer is covered by a photo resist. When the metal layer is etched to form the channel, the photo resist is also etched, such that part of the channel is exposed.

After the gate, the source and the drain of the COA display panel are formed, a first passivation layer is deposited on the surface of the COA display panel, and a connecting through hole is formed on the first passivation layer to expose part of the drain, the source or the gate.

The first passivation layer includes at least one of SiNx and SiOx. In another embodiment, the first passivation layer may be other passivation material, and it is not limited thereto.

Wherein the color resist layer includes red, green, blue three color resist arranged in order.

Specifically, the color resist layer is formed by: applying the color resist layer on first passivation layer, and exposing the color resist layer by using a gray level mask, such that the color resist layer has areas of different thickness. At least one through hole is formed by etching part of the color resist layer. The through hole is corresponding to a through hole of the first passivation layer to expose part of the drain or the source, such that the source or the drain is connected with the corresponding signal line via the through hole. Wherein the pixel electrode is formed on a surface of the color resist layer.

Due that the edge of the opening of the through hole is arc-shaped, it is effectively avoided that liquid is piled up outside the through hole 21 in the process, for example, in the process of forming an alignment film. Due that an alignment solution can be directly flowed into the through hole via the arc-shaped edge of the opening of the through hole, it is avoided that the alignment solution is piled up because of the step opening of the through hole, so as to improve the displaying quality of the COA display panel.

In one embodiment, the through hole is formed by exposing the color resist layer by using a half tone mask (HTM), as shown in FIG. 3. For example, by utilizing the area of semi-permeable membrane and exposure amount, such that the thickness of the corresponding color resist on the scanning line is different from the thickness of displaying area. That is, the edge of the opening of the through hole on the color resist layer is arc-shaped. Therefore, the height difference of landform is smooth near the through hole, not steep, such that the alignment solution can flow into the through hole smoothly, and is not piled up in the edge of the through hole, so as to display images normally.

In another embodiment, the through hole is formed by the mask pattern as shown in FIG. 4. The mask 41 has a slit in the opening 411 of the mask, and the size and the location of the opening 411 of the mask is corresponding to the size and the location of the through hole 21 of the color resist layer. The opening 411 of the mask has a plurality of slits 4111 and openings 4112. Therefore, by exposing the color resist layer via the opening 411 of the mask, due that the exposure amount of the slit 4111 is less than the exposure amount of the opening 4112, a little light through the slit 4111 can generate a diffraction, such that the photoresist corresponding to the slit 4111 and the photoresist nearby form a smooth edge of the opening, wherein the thickness is decreasing slowly. Therefore, an arc-shape of the edge of the through hole is formed via the slit 4111 and the opening 4112. After exposure and etch, the opening of the through hole nearby form smooth landform. When applying the alignment solution, the alignment solution can flow into the through hole smoothly, and is not piled up in the edge of the opening, so as to display images normally. The width of the slit is between 4 μm and 9 μm. Due to above width range, the difference between the width of the slit and the opening of the conventional mask can be enlarged, and the exposure amount can be insured. It is noted that the width of the slit described above is a preferred range, the difference, for example, 10% or 20%, between the practical width of the slit and the width of the slit described above is belong to the scope of the present disclosure.

The mask 31 and the mask 41 of the varying embodiment and detailed description are described above, and referring to the corresponding description and FIG. 3 and FIG. 4, and it is omitted herein.

In another embodiment, to reduce the pile up of the alignment solution, the color resist further includes a flow channel, the flow channel is connected with the at least one through hole, and the flow channel extends to the corresponding area of the pixel electrode. As shown in FIG. 5, FIG. 5 is a top-view schematic diagram of the location relationship between the pixel electrode and location of the through hole in accordance with another embodiment of the present disclosure. In the embodiment of FIG. 5, the through hole 21 is spaced apart from the pixel electrode 30 and connected with the pixel electrode 30 through the flow channel 22 that is connected with the through hole 21, and the flow channel 22 extends to the corresponding area of the pixel electrode 30.

The pixel electrode includes ITO electrode. In another embodiment, the ITO electrode can be replaced by another electrode, and it is not limited thereto.

In another embodiment, after the pixel electrode is formed, in order to manufacture a complete COA display panel, after the step 802 of covering the color resist layer on the component layer, and forming the at least one through hole on the color resist layer; wherein an edge of an opening of the at least one through hole is arc-shaped, the manufacturing method further includes step 803: forming a pixel electrode 30 on the color resist layer, the pixel electrode 30 being connected with a thin-film transistor of the component layer via the through hole 21; and step 804: applying an alignment solution to the pixel electrode layer 30.

Preferredly, before the step 803, the manufacturing method further includes forming a second passivation layer process, such that the second passivation layer is formed between the color resist layer 20 and pixel electrode layer 30, and the second passivation layer is connected with an opening to expose the through hole 21. The second passivation layer includes at least one of SiNx and SiOx. In another embodiment, the first passivation layer may be other passivation material, and it is not limited thereto. Due that the edge of the opening of the through hole 21 in the present disclosure is arc-shaped, the alignment solution is not piled up in the edge of the through hole, so as to improve the displaying quality.

As shown in FIG. 5, the through hole 21 is connected with the flow channel 22, such that the alignment solution can be guided into the pixel area rapidly, and is not piled up inside the through hole 21 or in the edge of the through hole 21, so as to improve the performance of the COA panel.

In the present disclosure, after a gate, a gate insulation layer, a oxide thin-film layer, and a source and a drain that are separated by a channel are sequentially formed on the first substrate, a first passivation layer is formed on the source, the drain and areas that are not covered by the source and the drain, and a color resist layer covering the first passivation layer, wherein the color resist layer is configured with at least one through hole, and an edge of an opening of the at least one through hole is arc-shaped, such that the source or the drain is connected with the corresponding signal line or the electrode via the through hole. Therefore, the landform near the through hole is smooth, and the alignment solution can flow into the through hole smoothly, and is not piled up in the edge of the through hole, so as to display images normally.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A color-filter on array (COA) display panel, comprising:
    an array substrate, a color filter substrate disposed opposite to the array substrate, wherein the array substrate comprises a component layer, a color resist layer covering and disposed on the component layer, and a pixel electrode disposed on the color resist layer and connected with the component layer through an at least one through hole;
    wherein the color resist layer comprises at least one through hole spaced apart from the pixel electrode and a flow channel connected with the at least one through hole; the flow channel extends to the corresponding area of the pixel electrode so that the at least through hole is connected with the pixel electrode through the flow channel, and an edge of an opening of the at least one through hole is arc-shaped.

2. The COA display panel as claimed in claim 1, wherein the at least one through hole is formed by exposing the color resist layer by using a half tone mask (HTM).

3. The COA display panel as claimed in claim 1, wherein the at least one through hole is formed by exposing the opening via a mask having a slit.

4. The COA display panel as claimed in claim 3, wherein a width of the slit is between 4 µm and 9 µm.

5. The COA display panel as claimed in claim 1, wherein the component layer further comprises a first substrate, a gate formed on the first substrate, a gate insulation layer and an oxide thin-film layer sequentially formed on the gate, the oxide thin-film layer further comprises a source and a drain; wherein the source and the drain are separated by a channel.

6. The COA display panel as claimed in claim 1, wherein the component layer is covered by a first passivation layer, and the color resist layer is formed on a surface of the first passivation layer.

7. The COA display panel as claimed in claim 1, wherein the array substrate further comprises a second passivation layer located between the color resist layer and the pixel electrode.

8. The COA display panel as claimed in claim 7, wherein the at least one through hole is defined by the color resist layer.

9. A color-filter on array (COA) display device, comprising:
    a COA display panel and a backlight module disposed corresponding to the COA display panel; the COA display panel comprising an array substrate, a color filter substrate disposed opposite to the array substrate, wherein the array substrate comprises a component layer, a color resist layer covering and disposed on the component layer, and a pixel electrode disposed on the color resist layer and connected with the component layer through an at least one through hole;
    wherein the color resist layer comprises at least one through hole spaced apart from the pixel electrode and a flow channel connected with the at least one through hole; the flow channel extends to the corresponding area of the pixel electrode so that the at least through hole is connected with the pixel electrode through the flow channel, and an edge of an opening of the at least one through hole is arc-shaped.

10. The COA display device as claimed in claim 9, wherein the at least one through hole is formed by exposing the color resist layer by using a half tone mask (HTM).

11. The COA display device as claimed in claim 9, wherein the at least one through hole is formed by exposing the opening via a mask having a slit.

12. The COA display device as claimed in claim 11, wherein a width of the slit is between 4 µm and 9 µm.

13. The COA display device as claimed in claim 9, wherein the component layer is covered by a first passivation layer, and the color resist layer is formed on a surface of the first passivation layer.

14. The COA display device as claimed in claim 9, wherein the array substrate further comprises a second passivation layer located between the color resist layer and the pixel electrode.

15. The COA display device as claimed in claim 14, wherein the at least one through hole is defined by the color resist layer.

16. A manufacturing method of a color-filter on array (COA) display panel, the manufacturing method comprising:
    forming a component layer;
    covering a color resist layer on the component layer, and forming at least one through hole on the color resist layer; wherein an edge of an opening of the at least one through hole is arc-shaped;
    forming a flow channel on the color resist layer, wherein the flow channel is connected with the at least one through hole, and the flow channel extends to the corresponding area of a pixel electrode spaced apart from the at least one through hole so that the at least through hole is connected with the pixel electrode through the flow channel;
    forming the pixel electrode on the color resist layer, wherein the pixel electrode is connected with a thin-film transistor of the component layer via the at least one through hole; and
    applying an alignment solution to the pixel electrode.

17. The manufacturing method as claimed in claim 16, wherein the step of covering a color resist layer on the component layer, and forming at least one through hole on the color resist layer further comprises:
    covering the color resist layer on the component layer; and
    exposing the color resist layer by using a half tone mask (HTM), and forming the at least one through hole on the color resist layer; wherein the edge of the opening of the at least one through hole is arc-shaped.

18. The manufacturing method as claimed in claim 17, wherein the half tone mask comprises three semi-permeable membranes that have different transmittances; and one of the three semi-permeable membranes is located between the other two semi-permeable membranes, and the other two semi-permeable membranes have the same transmittance.

19. The manufacturing method as claimed in claim 16, wherein the step of covering a color resist layer on the component layer, and forming at least one through hole on the color resist layer further comprises:

covering the color resist layer on the component layer; and exposing the color resist layer by the opening via a mask having a slit, and forming the at least one through hole on the color resist layer; wherein the edge of the opening of the at least one through hole is arc-shaped.

20. The manufacturing method as claimed in claim 19, wherein the mask defines a plurality of slits and a plurality of openings, and an exposure amount of each of the plurality of slits is less than an exposure amount of each of the plurality of openings.

* * * * *